United States Patent
Brown et al.

(10) Patent No.: US 7,219,270 B1
(45) Date of Patent: May 15, 2007

(54) DEVICE AND METHOD FOR USING A LESSENED LOAD TO MEASURE SIGNAL SKEW AT THE OUTPUT OF AN INTEGRATED CIRCUIT

(75) Inventors: Jeffrey S. Brown, Ft. Collins, CO (US); Craig R. Chafin, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 504 days.

(21) Appl. No.: 10/719,878

(22) Filed: Nov. 21, 2003

(51) Int. Cl.
*G11B 20/20* (2006.01)
(52) U.S. Cl. .................. 714/700; 714/724; 360/26
(58) Field of Classification Search ............. 714/724, 714/700; 360/26
See application file for complete search history.

(56) References Cited

U.S. PATENT DOCUMENTS

| | | | |
|---|---|---|---|
| 4,929,889 A | 5/1990 | Seiler et al. | |
| 5,231,598 A * | 7/1993 | Vlahos | ...................... 714/700 |
| 5,289,477 A | 2/1994 | Lenta et al. | |
| 5,991,890 A | 11/1999 | Brown et al. | |
| 6,594,797 B1 * | 7/2003 | Dudley et al. | ............... 714/815 |
| 6,671,860 B2 * | 12/2003 | Langford, II | ................... 716/2 |
| 6,737,852 B2 * | 5/2004 | Soma et al. | ............. 324/76.74 |
| 6,937,852 B2 * | 8/2005 | Pehrsson | ..................... 455/416 |
| 6,981,192 B2 * | 12/2005 | Panis | ......................... 714/740 |

* cited by examiner

*Primary Examiner*—Albert Decady
*Assistant Examiner*—Esaw Abraham
(74) *Attorney, Agent, or Firm*—Daffer McDaniel, LLP

(57) ABSTRACT

A device and method are provided for testing the timing of an output signal from a circuit. The output signal can be sent from a circuit contained within a portion of an integrated circuit, and represents a response to a test pattern or stimuli applied to that circuit. The output signal is compared to an expected output signal to determine skew of that signal relative to the clocking of the circuit. Testing the output signal involves placing a characterization path within the functional path of the output signal, between the circuits being tested and an output terminal that can receive a measurement device. By placing the characterization path into the functional path, the output signal sees only a single load gate terminal of, for example, a logic gate. The reduced loading not only positively impacts the normal operation of the output signal, but also beneficially minimizes the possibility of any inaccuracies in the characterization testing.

19 Claims, 3 Drawing Sheets

DEVICE AND METHOD FOR USING A LESSENED LOAD TO MEASURE SIGNAL SKEW AT THE OUTPUT OF AN INTEGRATED CIRCUIT

BACKGROUND OF THE INVENTION

1. Field of Invention

This invention relates to integrated circuits and, more particularly, to the testing of a circuit for signal skewing at the output of the circuit using a relatively low impedance test characterization load.

2. Description of Related Art

The following descriptions and examples are not admitted to be prior art by virtue of their inclusion within this section.

Integrated circuits manufactured today generally have thousands of active and passive devices interconnected on a single monolithic substrate. Advances in design and manufacturing techniques provide even greater levels of integration, whereby multiple subsystems can be arranged on a single substrate. Each system performs a specified function and ideally presents an output at an expected time.

To ensure the proper operation of each system upon an integrated circuit, the integrated circuit is generally tested as part of a debug operation, either as the integrated circuit is being designed or after it has been designed and is in production. Data collected from the test operation may be used to improve performance or enhance yield. The basis for testing of complex integrated circuits is to isolate a particular circuit subsystem portion of the integrated circuit, and test that portion. The portion of the integrated circuit that receives test stimuli can be referred to as a device under test or "DUT." The terms DUT and integrated circuit portion, or simply circuit, are henceforth used interchangeably.

A typical test operation involves applying the input stimuli or test vector to the DUT, and reading a response at the DUT output. A comparison is then made of an expected DUT output to the actual DUT output on a cycle-by-cycle basis. If the output signal and the expected output signal are not in agreement, the DUT is usually considered defective.

There are numerous mechanisms used to apply test vectors, read output signals, and compare the output signals to expected output signals. For example, the integrated circuit may contain its own logic built into the monolithic substrate, often referred to as a built-in-self-test (BIST). The BIST circuitry applies the vector and reads the response without the use of an external tester. Another technique is generally referred to as the scan test technique, wherein data for testing is shifted into the DUT and the results are read and thereafter compared against the expected results. Instead of BIST, external testers can be used to supply the stimuli and read the response via, for example, input and output pins on the integrated circuit.

Multiplexers can be used to select the pins as being either in a test mode or a normal mode of operation. For example, a multiplexer on an input pin can be selected to receive a test vector, and a multiplexer on an output pin can be selected to present the test result. If the multiplexers are not selected in a test mode, then the input pins can be used to receive, for example, an address and the output pins can be used to send corresponding data.

Regardless of the test technique chosen, a test operation typically involves two types of tests: a functionality test and a timing (or characterization) test. Functionality testing might simply be writing a test pattern of 1s and 0s into the DUT and reading the logic values from the DUT. Hopefully, the pattern read from the DUT will match the pattern written to the DUT. Functionality testing thereby simply involves checking whether the output signal logic value matches the expected output signal. Consideration is not given to whether the output signal arrives at a particular time and, thus, timing testing or characterization testing is often needed in addition to functional testing.

Characterization testing generally involves checking that the output of the DUT occurs at a proper, specified time. Typical characterization tests include tests to determine the output signal transitions relative to clock transitions, propagation delays, set-up and hold times, access times, minimum and maximum speed of operation, rise and fall time, and others. These tests are captured in timing characterizations and used in a test system to verify performance of the device. The various comparisons of when signals appear relative to when the signal is expected to appear is henceforth referred to as signal skew. Thus, comparing a signal occurring at a particular time to when that signal is expected to occur is hereby referred to, generally, as characterization testing or simply testing or measuring for signal skew.

It would be desirable to perform both functional and characterization testing on separate circuits (DUTs) within an overall integrated circuit. It would also be desirable to place the circuits used for performing characterization testing upon the integrated circuit. The characterization testing thereby forms a characterization path. It would also be desirable to carefully implement the characterization path into a functional path so that the DUT output does not experience undue loading of any signal placed on that output. If the loading is properly minimized, then any output signal arising from a test pattern will arrive on the tester without undue delay. Moreover, during normal operations, the characterization path will not slow the ramp times on the output pin of the integrated circuit and, during test times, will not induce inaccuracies into the characterization result.

SUMMARY OF THE INVENTION

The problems outlined above are in large part solved by an improved test device and method. The test device involves test circuitry placed on the same integrated circuit as the DUT. The DUT can operate in normal fashion to produce a desired output, or if placed in test mode, can produce both functional and characterization test outputs. The output path from the DUT can be sent directly to an output pad of the integrated circuit via a functional path. Therefore, placed within the functional path is a characterization path. The combination functional and characterization path induces only one load internal to the integrated circuit on the output of the DUT. Thus, instead of having the output of the DUT go to two loads: a functional path and a characterization path in parallel, the DUT output goes to only one load, i.e., the singular characterization/functional path.

The characterization path can be made up of certain combinatorial and sequential devices. These devices are introduced into the functional path between the device output and the output terminal of the integrated circuit using, for example, an exclusive OR (EX OR) gate and a latch as the characterization path. The DUT output can be compared in time relative to the clocking signal sent to the DUT. The difference in time between the DUT clock and the actual DUT output constitute an access time. The characterization testing can, therefore, be used to test access times, but it is also contemplated that the characterization testing can compare any two signal and/or clock edges, and that the signal and clock edges can be compared against an expected signal or clock edge to determine, for example, propagation delays, set-up and hold times, access times, minimum and maximum speed of operation, rise and fall times, skews, and others.

According to one embodiment, a device is used for measuring signal skew. The device includes a functional path extending from a DUT (generally, a circuit) to an output terminal. The circuit can be, for example, a portion of an integrated circuit and the output terminal can be a bonding pad on the integrated circuit. A logic gate can be placed within the functional path for receiving an output signal from the circuit on one input of the logic gate, and an expected output signal on another input of the logic gate. A latch can also be placed within the functional path for receiving an output of the logic gate and forwarding the output of the logic gate from the latch onto the output terminal during times when the latch enters a transparent mode. Both the logic gate and the latch are placed within the only path between the output of the circuit and the output terminal. There are no other paths that exist from the circuit to the output terminal and, thus, the only load that would appear to the circuit is the input of the logic gate.

According to another embodiment, both access time and signal skews can be determined at an output terminal of a circuit. The access time and signal skew are measured by a device having a first series-connected logic gate and latch, and a second series-connected logic gate and latch. The first series-connected logic gate and latch are coupled to receive a clock signal forwarded to the circuit, and to latch a transition of the clock signal. The second series-connected logic gate and latch are coupled to receive an output signal from the circuit as well as an expected output signal, and to latch a transition of the output signal. A delay measurement device, either internal to or external from the integrated circuit that bears the circuit, is coupled to the output terminal for measuring the time difference between the transitions of the clock signal and the transition of the output signal. These time differences constitute the access time (signal skew) being measured.

According to yet another embodiment, a method is contemplated for measuring signal skew. The method includes the steps of latching a transition of a clocking signal. Thereafter, the clocking signal is forwarded to a circuit. Using the clock signal to produce an output signal from the circuit, a transition of the output signal is then latched. The signal skew is then measured as a time difference between a transition of the output signal appearing on the output terminal and the time in which the transition occurred on the clocking signal. A test characterization enable signal can be used to enable latching of the output signal and measuring the signal skew. However, if the test characterization enable signal is deactivated, the steps of latching the transition of the output signal and measuring the signal skew can also be disabled. Thus, the test characterization enable signal can be used to either enable test operation (i.e., characterization testing) or normal operation of the circuit or DUT.

BRIEF DESCRIPTION OF THE DRAWINGS

Other objects and advantages of the invention will become apparent upon reading the following detailed description and upon reference to the accompanying drawings in which.

Figure 1:
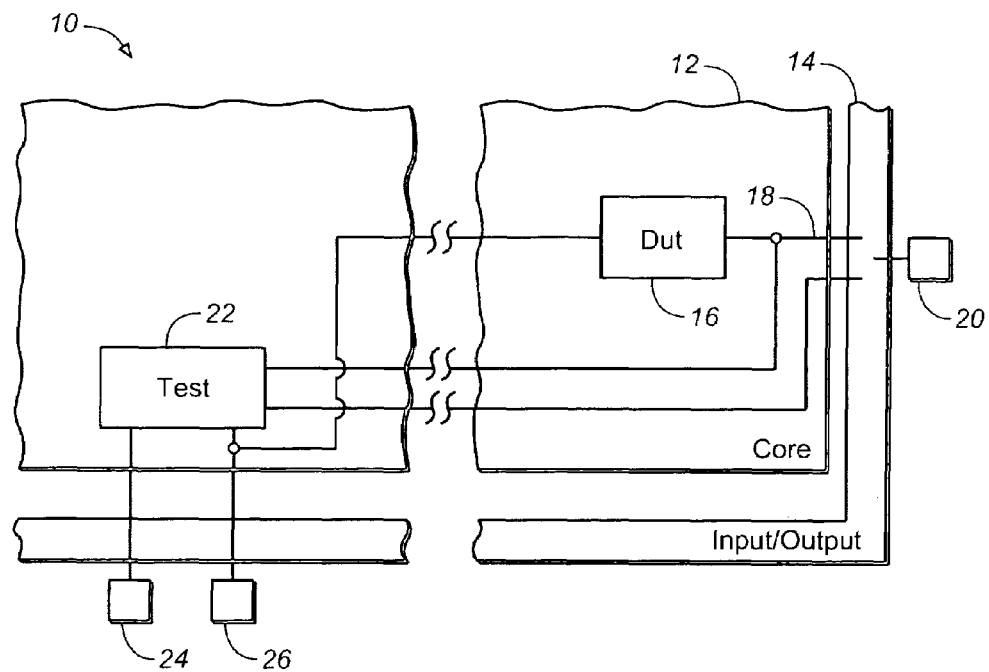
FIG. 1 is a plan diagram of an integrated circuit having a circuit portion of which is tested (i.e., DUT) by a test circuit also located upon the integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates an integrated circuit 10. Integrated circuit 10 can be configured in numerous ways such as, for example, a core section 12 surrounded by an input/output section 14. Possibly placed within core section 12 is a subsystem of integrated circuit 10 which can be a circuit, such as DUT 16. DUT 16 is shown having an output forwarded across a conductor 18 to input/output section 14. Contained within input/output section 14 can be various buffers and/or multiplexers that forward the output signal on conductor 18 to, for example, a bonding pad 20. When packaged, the bonding pad is electrically connected to an external pin on the outside of the package for communication to a target device external from the packaged integrated circuit.

In addition to sending an output signal to output terminal 20 via conductor 18, the output signal can be tested by sending the output signal to a test device 22. Like DUT 16, test device 22 can also be arranged within the core section 12. Test device 22 may receive signals either derived internal to core 12 or, as shown, from input terminal 24 or DUT clocking terminal 26. When DUT 16 receives a clocking signal from terminal 26, the actual output signal from DUT 16 is sent to test device 22. The actual output signal is then compared to an expected output signal sent to test device 22 via input terminal 24. The comparison result is then sent from test device 22 to output terminal 20, wherein a measurement device can then read the signal skew, access time, propagation delay, etc., between the actual output and clocking signal.

FIG. 1 illustrates only one example in which a DUT undergoes characterization testing. As shown, a characterization path extends from conductor 18 to test device 22, and thereafter back to output terminal 20. The additional routing between DUT 16 and test device 22 can add substantial capacitive loading, which can induce inaccuracies in the characterization test measurement. Moreover, even if test device 22 is brought closer to DUT 16, DUT 16 still "sees" two loads: the input/output load coupled to conductor 18 and the characterization path also coupled to conductor 18.

Figure 2:
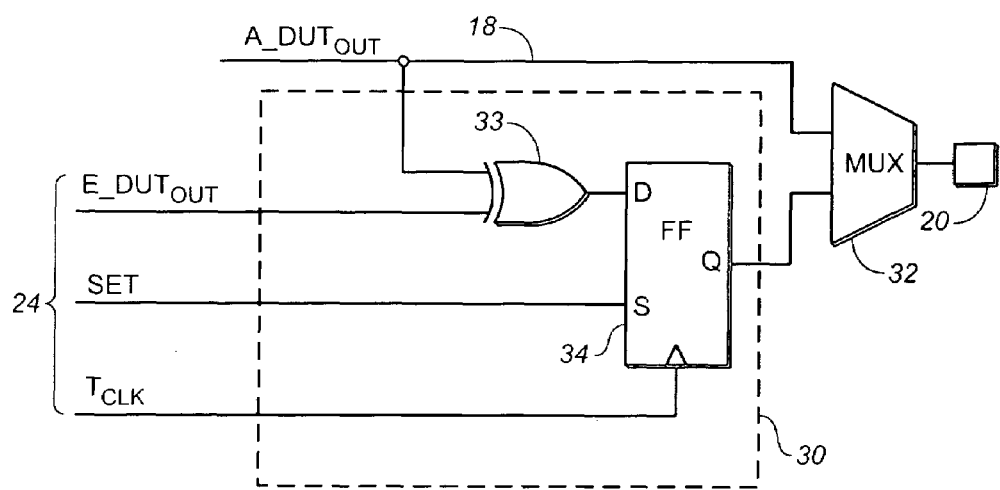
FIG. 2 is a block diagram of the DUT output connected to two load circuit to form a functional path to an output pad and a characterization path to the output pad via the test circuit.

FIG. 2 indicates one example by which a characterization path 30 is coupled to conductor 18. Conductor 18 indicates the functional path of the actual DUT output signal (A_DUT$_{OUT}$) from the DUT to the input/output ring and, specifically, the multiplexer 32 therein. Regardless of whether the output signal is sent during normal operation or during a test operation, the output signal (A_DUT$_{OUT}$) sees two loads: the high impedance gate input to multiplexer 32 and the high impedance gate input of, for example, logic gate 33 of characterization path 30.

Logic gate 33 and flip-flop 34 can be used to form test device 22 (FIG. 1). The expected output signal (E_DUT$_{OUT}$) is sent to EX OR gate 33, and gate 33 will forward a logic 0 value whenever the actual and expected output signals match each other in logic value. Thus, if the expected output precedes the actual output within a particular period, the time in which the actual output transitions to the expected output will cause logic gate 33 to produce a match signal to the D input of flip-flop 34. Assuming the set input of flip-flop 34 is active prior to the match signal occurring, the match signal will be transferred onto the Q output during a rising edge of T$_{CLK}$. Flip-flop 34 is, therefore, said to be an edge-triggered flip-flop. Contrasted to a transparent latch, an edge-triggered flip-flop is never transparent from its data input D to its output Q. When the clock input T$_{CLK}$ is at a logic 0 value, the output Q does not follow the D input and remains unchanged. However, the value at the D input is captured or stored at the time the clock input makes a 0-to-1 transition. Further distinctions between a transparent latch and an edge-triggered flip-flop will be set forth herein below.

Edge-triggered flip-flops are generally clocked by a clocking signal, and not all edge-triggered flip-flops have set and clear jam-type inputs. However, the set signal is needed in FIG. 2 to discern instances in which a match signal may be present before the expected output signal is present. Thus, while the actual and expected output signal may both be at logic 0 value and later at logic 1 value, only in the latter instance when the flip-flop is set will the match signal be forwarded onto the Q output. Prior to setting the flip-flop, a reset state is present so that prior to the expected output signal, the match signal will not be forwarded to the flip-flop output. Further details of why a set signal is needed are described in reference to FIG. 5.

Figure 3:
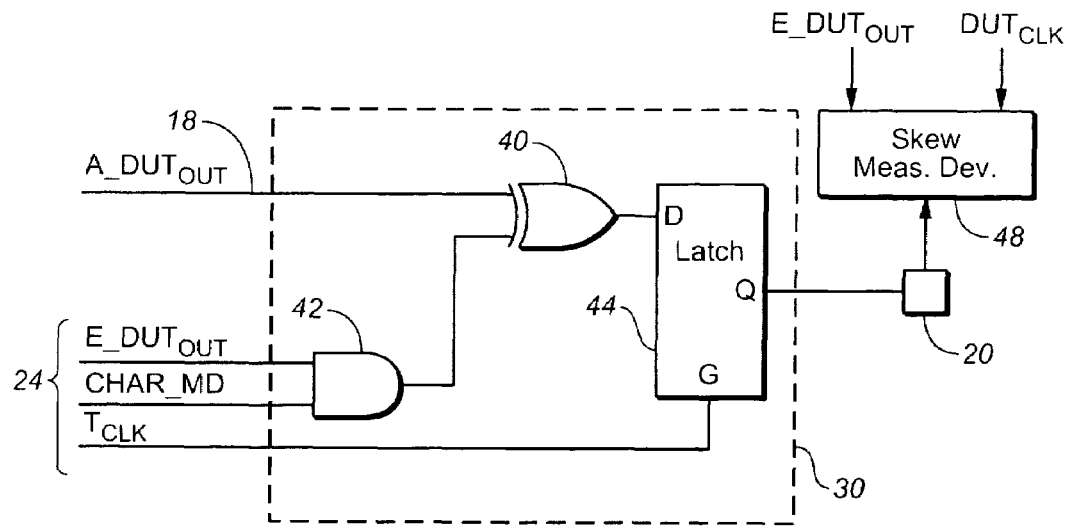
FIG. 3 is a block diagram of the DUT output connected to a single load to form both the functional path and the characterization path.

Turning now to FIG. 3, an alternative arrangement is presented for having only one load (rather than two) on the output signal (A_DUT$_{OUT}$). As shown, the output signal of FIG. 3 is sent only into an input of EX OR gate 40. Coupled to the other input of logic gate 40 is the output of a second logic gate 42. Logic gate 42 can be an AND gate having two inputs. The first input can be the expected output signal (E_DUT$_{OUT}$) and the second input can be a test characterization enable mode signal (CHAR_MD). Only at times in which the test characterization enable signal is active (e.g., at a logic 1 value) will the active expected output signal be forwarded as a logic 1 value to the input of logic gate 40. Preferably, the test characterization enable signal and the expected output signal precede the output signal, such that when the output signal transitions to an active state, a match signal will be produced at the output of logic gate 40.

Latch 44 will read the match signal and transfer the D input to the Q output when the control input C is active. Thus, latch 44 is a gated latch and, specifically, is a gated transparent latch. By definition, a transparent latch is one which forces the Q output to follow the D input when the control input is active, and latches the value of the D input at the time in which the control input goes inactive. Thus, a transparent latch will convey the D input to the Q output when the control input goes active, and the D input remains on the Q output even though the control input goes inactive. This differs from an edge-triggered flip-flop, which causes the D input to be conveyed onto the Q output only when the clock input transitions to an active state (i.e., an edge-triggered flip-flop is never transparent from the D input to the Q output).

Details regarding the differences between an edge-triggered flip-flop and a transparent latch are well-known and need not be discussed further other than edge-triggered flip-flops are desirable for many feedback applications in that, due to their nontransparent property, their output can be fed back as inputs to the device without causing oscillation. Thus, there are certain applications in which edge-triggered flip-flops are desirable over transparent latches, and vice-versa. One benefit, however, of a transparent latch is its simplicity.

A transparent latch as illustrated in FIG. 3 does not require any jam-type inputs, such as a set input. Even though an active match signal can be presented to the D input before the expected output occurs (provided the characterization enable signal is enabled), latch 44 automatically resets once the swept T$_{CLK}$ transitions back to an inactive state due to the transparent nature of latch 44. Thus, when the next period occurs, latch 44 is reset and remains reset until the expected and actual output signals match one another. Therefore, an advantage of the embodiment shown in FIG. 3 is that the set signal of FIG. 2 is no longer needed prior to the test characterization cycle. Each time latch 44 is opened (when the control input becomes active), the latch 44 will automatically reset itself since the output signal will no longer match the expected output signal at the beginning of the characterization cycle or period.

FIG. 3 illustrates characterization path 30 placed within the functional path, i.e., between the output signal and the output terminal 20. Thus, instead of coupling the characterization path onto the conductor which forms the functional path and presenting both paths to a multiplexer (as shown in FIG. 2), characterization path 30 is placed in the functional path by breaking apart the functional path and inserting the characterization path therein. By inserting the characterization path into the functional path, only one load is presented to the output signal from the DUT.

Characterization tests are performed by sending the expected output signal, the test characterization enable signal, and the test clocking signal to characterization path 30 via bus 24. Bus 24 can be separate bonding pads or can be derived from programmed circuitry within the core of the integrated circuit. A measurement device 48 can measure the time difference between the clocking signal sent to the DUT (DUT$_{CLK}$) and the output signal (A_DUT$_{OUT}$) sent from the DUT. Measurement device 48 can, therefore, determine the amount of skew on the output signal as well as other timing differences between the clocking input signal and the output signal produced from, e.g., a circuit that receives the clocking input signal.

Figure 4:
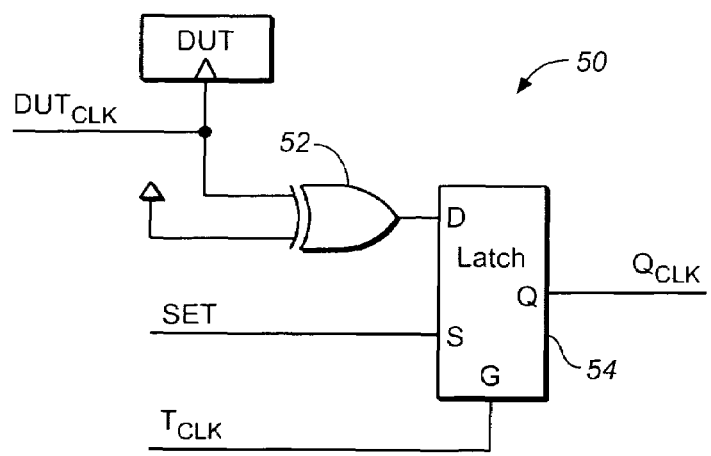
FIG. 4 is a block diagram of the DUT clocking signal forwarded to a characterization path for determining an access time for the DUT.

FIG. 4 illustrates a test device 50 used to determine, for example, access time. The input clocking signal (DUT$_{CLK}$) is forwarded to logic gate 52, along with a power supply voltage (e.g., V$_{DD}$). Once the clocking input signal goes to a logic high voltage value, the D input receives and latches that value onto the Q output. The Q output is essentially the latch DUT$_{CLK}$ clock when T$_{CLK}$ transitions after the DUT$_{CLK}$. Latching of the D input to the Q output occurs at the falling edge of T$_{CLK}$.

Figure 5:
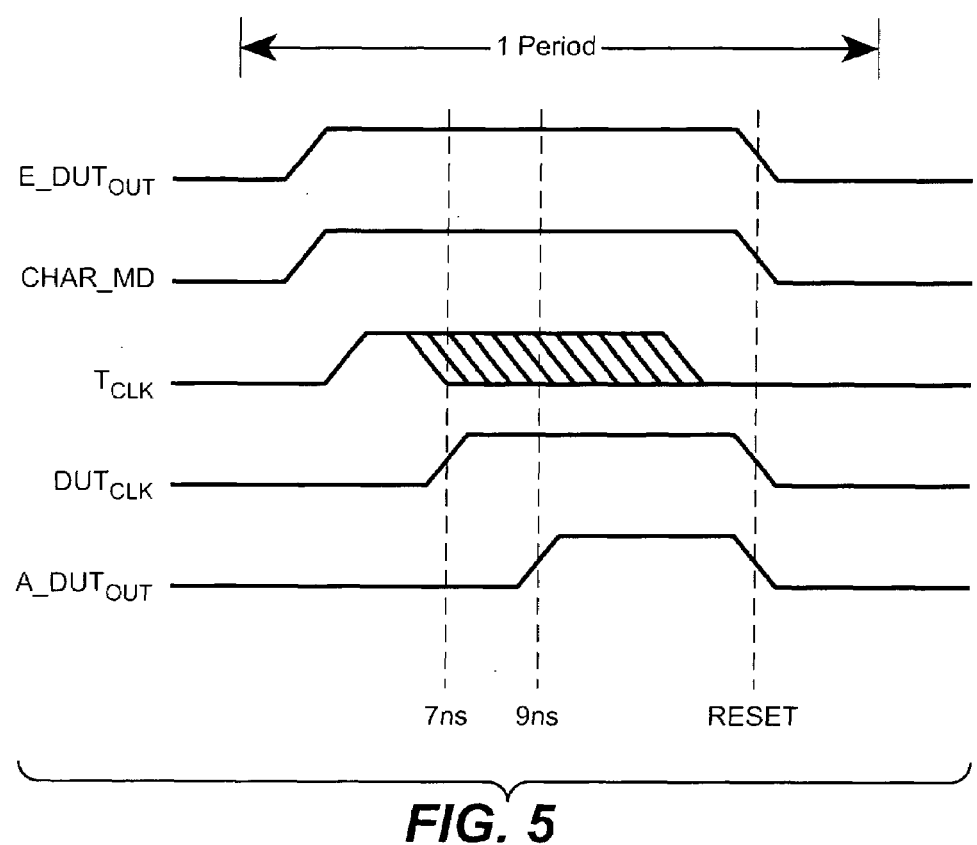
FIG. 5 is a timing diagram of the signal skew of the DUT clocking signal and the DUT output signal measured as a function of an expected DUT clocking signal and DUT output signal.

FIG. 5 illustrates a timing diagram of the various signals sent to the characterization path, as well as signals read from the characterization path. Specifically, if a latch is used, the expected output signal ($E\_DUT_{OUT}$) is setup prior to $DUT_{CLK}$ and $A\_DUT_{OUT}$. This will set the latch to receive a match signal during the leading edge of the output signal ($A\_DUT_{OUT}$). a test characterization enable signal (CHAR_MD) is also set prior to or during the leading edge of the expected output signal. Thereafter, when the output signal leading edge occurs, a match signal will then be presented to the latch.

The test pattern is repeated for different $T_{CLK}$ input waveforms. Inside one period of the pattern, FIG. 5 illustrates $T_{CLK}$'s falling edge having been swept from an initial time to an ending time. For example, the initial falling time might be 5 ns and the latest falling time might be 14 ns. Using this example, 7 ns is the smallest edge that will cause the $DUT_{CLK}$ to match the power supply or $V_{DD}$ (FIG. 4). In addition, 9 ns is the smallest edge that causes $DUT_{OUT}$ to match $E\_DUT_{OUT}$. In this example, the $DUT_{CLK}$ to $DUT_{OUT}$ delay (i.e., access time) is the difference between 9 ns and 7 ns, or 2 ns.

It will be appreciated that various other readings can be taken knowing when signals are expected on the output terminal, and when those signals actually occur. Such measurement readings are within the scope and spirit of the present characterization path and measurement device. It is understood that there can be modifications made to the various test devices and circuitry for carrying out functional and characterization tests. However, it is recognized that such modifications and alternative embodiments which maintain the general concepts hereof will be apparent to those skilled in the art in view of this description. It is intended that the following claims be interpreted to embrace all such modifications and changes. Accordingly, the specification and drawings are to be regarded in an illustrative rather than a restrictive sense.

What is claimed is:

1. A device for measuring signal skew, comprising:
   a functional path extending from a device under test (DUT) to a bonding pad of an integrated circuit;
   a logic gate placed within the functional path for receiving an output signal directly from the DUT on one input of the logic gate and an expected output signal on another input of the logic gate absent any circuitry beyond the logic gate coupled for receiving the output signal; and
   a latch placed within the functional path for receiving an output of the logic gate and forwarding the output of the logic gate from the latch onto the bonding pad during times when the latch enters a transparent mode.

2. The device as recited in claim 1, further comprising a second logic gate coupled to receive the expected output signal and a test characterization enable signal, wherein the second logic gate forwards the expected output signal to the logic gate whenever the test characterization enable signal is active.

3. The device as recited in claim 2, wherein the logic gate is coupled to forward a match signal to the latch during times when the test characterization enable signal is active, and the output signal and the expected output are at the same logic value, and wherein the logic gate is coupled to forward the output signal to the latch during times when the test characterization enable signal is inactive.

4. The device as recited in claim 3, wherein the latch is coupled to forward the match signal or the output signal onto the output terminal during times when the latch enters the transparent mode by activating a gate terminal of the latch with a plurality of clock signal edges delayed in time with respect to each other.

5. The device as recited in claim 1, wherein the expected output signal transitions to an active state at a predetermined time when essentially no skew occurs on the output signal as measured on the output terminal.

6. The device as recited in claim 5, wherein the latch is coupled to forward the match signal onto the output terminal when the output signal transitions to the active state, preceded in time by the expected output signal transitioning to the active state.

7. A device for measuring access time and signal skew at an output terminal of a circuit, comprising:
   a first series-connected logic gate and latch coupled to receive a clock signal forwarded to the circuit, and to latch a transition of a clock signal;
   a second series-connected logic gate and latch coupled to receive an output signal from the circuit and an expected output signal, and to latch a transition of the output signal; and
   a delay measurement device coupled to the output terminal for measuring the time difference between the transition of the clock signal and the transition of the output signal.

8. The device as recited in claim 7, wherein the latch of the first series-connected logic gate and latch comprises a pair of inputs, one of which is coupled to receive the clock signal and the other is coupled to receive a power supply voltage.

9. The device as recited in claim 7, wherein the latch of the second series-connected logic gate and latch comprises a pair of inputs, one of which is coupled to receive the output signal and the other is coupled to receive the expected output signal during times when the expected output signal is enabled.

10. The device as recited in claim 7, further comprising another logic gate coupled to receive the expected output signal and a test characterization enable signal, and to forward the expected output signal to the second series-connected logic gate and latch whenever the test characterization enable signal is active.

11. The device as recited in claim 7, wherein the delay measurement device is configured to produce the expected output signal at a predetermined time and to produce a plurality of clock signal edges successively delayed in time from an initial time to an ending time.

12. The device as recited in claim 11, wherein the latches of the first and second series-connected logic gates and latches receive the plurality of clock signal edges on a gated input of the latches for placing the transition of the output signal onto the output terminal at a measured time coinciding with one of the clock signal edges that occur between the initial time and the ending time.

13. The device as recited in claim 7, wherein the delay measurement device is configured to measure the access time as the time difference between the transition of the clock signal and the transition of the output signal.

14. The device as recited in claim 7, wherein the delay measurement device is configured to measure the signal skew as the time difference between a transition of the clock signal and the transition of the output signal.

15. A method for measuring signal skew, comprising:
   latching a transition of a clocking signal;
   forwarding the clocking signal to a circuit;
   using the clocking signal to produce an output signal from the circuit;
   latching a transition of the output signal; and measuring the signal skew as a time difference between the transition of the clocking signal and when the transition of the output signal occurs.

16. The method as recited in claim 15, wherein said latching a transition of the clocking signal comprises recording when the transition of the clocking signal occurred.

17. The method as recited in claim 15, wherein said latching a transition of the output signal comprises recording when the transition of the output signal occurred relative to when the transition of the clocking signal occurred.

18. The method as recited in claim 15, further comprising activating a test characterization enable signal to enable the steps of latching the transition of the output signal and measuring the signal skew.

19. The method as recited in claim 15, further comprising deactivating a test characterization enable signal to disable the steps of latching the transition of the output signal and measuring the signal skew.

* * * * *